United States Patent
Suzuki

(10) Patent No.: US 6,651,680 B1
(45) Date of Patent: Nov. 25, 2003

(54) WASHING APPARATUS WITH UV EXPOSURE AND FIRST AND SECOND ULTRASONIC CLEANING VESSELS

(75) Inventor: Masaaki Suzuki, Kanagawa-ken (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/695,925

(22) Filed: Oct. 26, 2000

Related U.S. Application Data

(62) Division of application No. 08/743,375, filed on Nov. 4, 1996, now Pat. No. 6,217,665, which is a continuation of application No. 08/013,314, filed on Feb. 4, 1993, now abandoned.

(30) Foreign Application Priority Data

Feb. 7, 1992  (JP) .............................................. 4-055985

(51) Int. Cl.⁷ ................................................. B08B 7/04
(52) U.S. Cl. .......................... 134/63; 134/64 R; 134/1; 134/902
(58) Field of Search ................................ 134/63, 64 R, 134/1, 1.3, 902

(56) References Cited

U.S. PATENT DOCUMENTS

| | | | |
|---|---|---|---|
| 4,028,135 A | 6/1977 | Vig et al. ....................... 134/1 |
| 4,341,592 A | 7/1982 | Shortes et al. .................. 134/2 |
| 4,715,392 A | 12/1987 | Abe et al. ...................... 134/62 |
| 5,068,040 A | 11/1991 | Jackson ....................... 210/748 |
| 5,071,488 A | * 12/1991 | Takayama et al. ............. 134/34 |
| 5,078,832 A | 1/1992 | Tanaka ....................... 134/1 X |
| 5,094,898 A | 3/1992 | Morita et al. .................. 428/64 |
| 5,150,239 A | 9/1992 | Watanabe et al. .............. 359/80 |
| 5,158,100 A | 10/1992 | Tanaka et al. ............... 134/105 |
| 5,185,059 A | 2/1993 | Nishida et al. ........... 156/659.1 |
| 5,198,634 A | 3/1993 | Mattson et al. ........ 219/121.43 |
| 5,215,592 A | 6/1993 | Jackson ......................... 134/1 |
| 5,372,651 A | 12/1994 | Kodama ....................... 134/26 |
| 5,747,387 A | 5/1998 | Koizumi et al. ............. 438/708 |

FOREIGN PATENT DOCUMENTS

| | | |
|---|---|---|
| JP | 02-000315 | 1/1990 |
| JP | 63-271938 | * 11/1998 |

OTHER PUBLICATIONS

Valiev et al., Interaction of Short–Wave UV Radiation on Thin Layers of Organic Compounds, Mickroelectronika, vol. 17, No. 6, pp. 522–7.

Vig., UV/Ozone Cleaning of Surfaces, J. Vac. Sci. Tech. No. A3(3) Part 1, May/Jun. 1985, 1027–1034.

McGraw-Hill Encyclopedia of Physics, Parker ed. (1983) 1135.

Zafonte et al., UV/Ozone Cleaning for Organics Removal on Silicon Wafers, SPIE vol. 470 Optical Microlithography III (1984) 164–175.

* cited by examiner

Primary Examiner—Alexander Markoff
(74) Attorney, Agent, or Firm—Fitzpatrick, Cella, Harper & Scinto

(57) ABSTRACT

Dirt, particularly of inorganic matter, attached to a substrate, such as a glass substrate for liquid crystal devices, is effectively removed by irradiating the substrate with ultraviolet rays including 184.9 nm and 253.7 nm in an oxygen-containing atmosphere in advance of wet cleaning with pure water. As a result, the wet cleaning time and the amount of pure water can be reduced.

4 Claims, 2 Drawing Sheets

WASHING APPARATUS WITH UV EXPOSURE AND FIRST AND SECOND ULTRASONIC CLEANING VESSELS

This application is a division of application Ser. No. 08/743,375 filed Nov. 4, 1996, (now U.S. Pat. No. 6,217, 665), which in turn is a continuation of application Ser. No. 08/013,314, filed Feb. 4, 1993 (now abandoned).

BACKGROUND OF THE INVENTION

The present invention relates to a method of cleaning substrates, particularly a method of cleaning substrates suitable for cleaning glass substrates for liquid crystal devices wherein dirt on a glass substrate causing an inferior product is removed during a liquid crystal device production process.

There have been known wet cleaning techniques using pure water for cleaning substrates for precision devices or appliances, such as glass substrates for liquid crystal devices. In the case of cleaning a glass substrate for a liquid crystal device already provided with a pattern of electrodes and before provision of an alignment film, for example, it has been ordinarily practiced to first remove dirt, such as dust and inorganic matter, by a combination of spraying, high pressure showering and/or ultrasonic cleaning respectively using pure water, optionally with brushing or ultrasonic cleaning with a detergent and cationic pure water as a pretreatment, and drain the water as by an air knife, a spinner or pulling out from warm pure water, or dry the substrate with, e.g., vapor of IPA (isopropyl alcohol).

It is also known to thereafter heat the glass substrate to about 150° C. and irradiate the substrate with ultraviolet rays at wavelengths of 184.9 nm and 253.7 nm so as to have oxygen in the air absorb the ultraviolet rays at 184.9 nm to generate ozone and have the ozone absorb the ultraviolet rays at 253.7 nm to generate oxygen radicals, by which organic matter is decomposed and removed.

However, the above-mentioned first washing with pure water for removal of dust or inorganic matter with pure water as by a combination of spraying, high pressure showering, ultrasonic cleaning, etc., requires some length of time, thus leading to an inferior throughput of the cleaning apparatus or requiring an elongated apparatus in order to retain a high throughput using the same length of time. Further, a large amount of water is required per sheet of glass substrate, and the cleaning cost is considerably expensive.

Further, if the pre-cleaning by brushing or ultrasonic cleaning using a detergent is performed before the cleaning with pure water, it is possible to obtain a sufficient cleaning effect even if a shorter time is used for the cleaning with pure water. However, for an identical throughput, this additionally requires a cleaning step using a detergent and a rinsing step, so that the total length of the required cleaning apparatus is not substantially changed. Further, the required amount of pure water is not substantially changed either because the rinsing step after the cleaning with a detergent requires an additional amount of pure water, thus also requiring a high process cost.

SUMMARY OF THE INVENTION

In order to solve the above-mentioned problems, an object of the present invention is to provide a method of cleaning a substrate, whereby dirt, such as inorganic and organic matters, can be effectively removed while shortening the wet cleaning time and reducing the amount of water used.

Another object of the present invention is to provide a method of cleaning a substrate, whereby a glass substrate can be effectively cleaned with a minimum amount of pure water and a short time with a simple apparatus arrangement and without complex process control.

According to the present invention, there is provided a method of cleaning a substrate for removing dirt on the substrate, comprising irradiating a substrate surface with ultraviolet rays including wavelengths of 184.9 nm and 253.7 nm in an oxygen-containing atmosphere, and then subjecting the substrate to wet cleaning with pure water.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
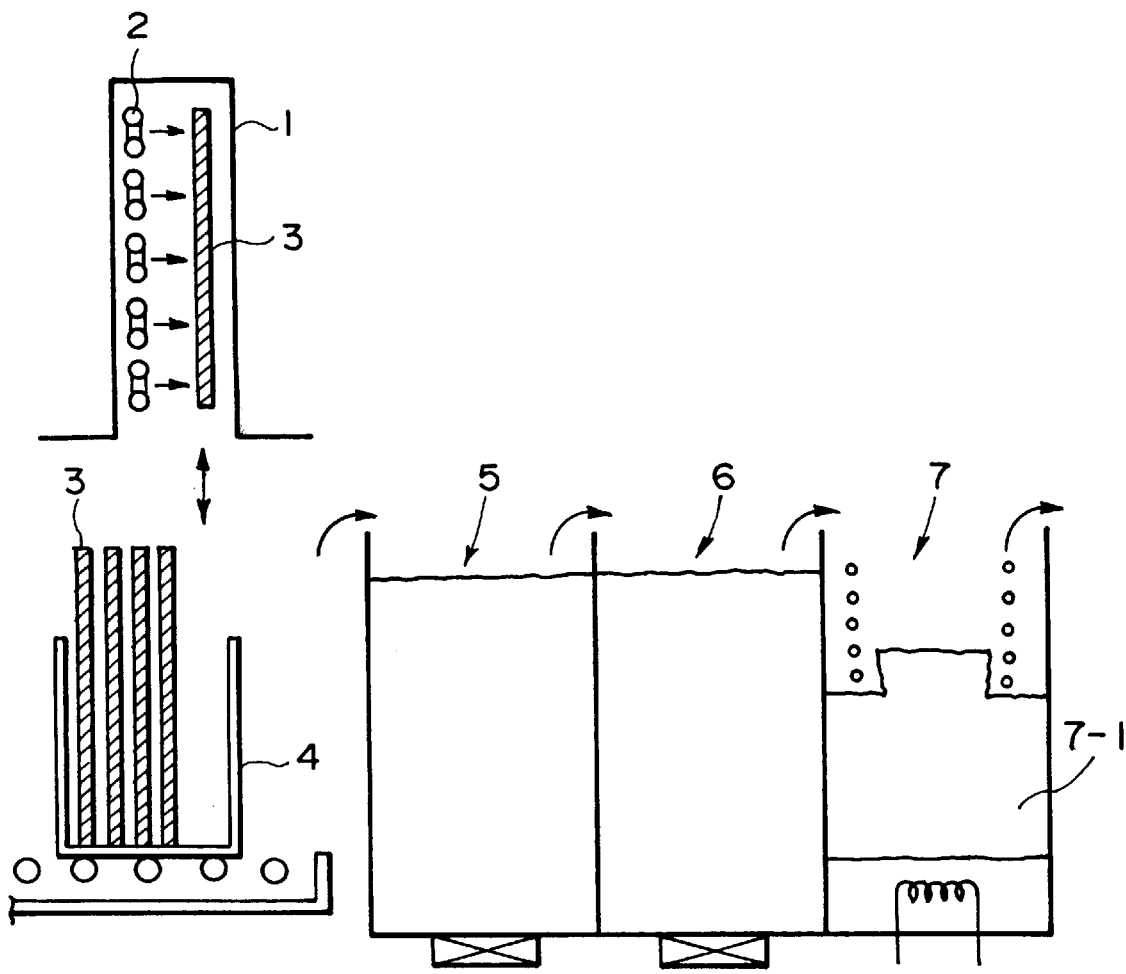
FIG. 1 is an illustration of a batch-type cleaning apparatus for use in a method of cleaning a substrate according to the present invention.

In a preferred embodiment of the present invention, a glass substrate for a liquid crystal device may be cleaned for removal of dirt thereon by first irradiating a surface of the substrate with ultraviolet rays including wavelengths of 184.9 nm and 253.7 nm in an oxygen-containing atmosphere and then subjecting the substrate to wet cleaning with pure water.

More specifically, in the cleaning method for removing dirt (foreign matter) on a glass substrate according to the present invention, immediately before the wet cleaning with pure water of the substrate, the surface of the substrate is simultaneously irradiated with ultraviolet rays including components with wavelengths of 184.9 nm and 253.7 nm, preferably having peaks at these wavelengths, whereby oxygen in the atmosphere absorbs ultraviolet rays at 184.9 nm to form ozone and the ozone absorbs ultraviolet rays at 253.7 nm to form oxygen radicals, with which the dirt of organic matter on the glass substrate is chemically removed and the surface tension of the glass surface is reduced to improve the wettability in advance to enhance the effect of cleaning dirt of inorganic matter in a subsequent cleaning step with pure water.

The irradiation means for issuing the above-mentioned wavelengths may be any, provided that they include sufficient amount of the above-mentioned wavelengths. Examples of which may include: discharge lamps, such as low pressure mercury lamps, black light fluorescent lamps, fluorescent chemical lamps, mercury arc lamps, and xenon arc lamps, and excimer lasers, such as KrF and ArF excimer lasers.

Such irradiation means can be combined in plurality as desired. It is also possible to use separate irradiation means for a wavelength of 184.9 nm and a wavelength of 253.7 nm.

The irradiation intensity of the ultraviolet rays can be varied depending on the degree of soiling or dirt on the substrate or desired cleanliness of the substrate but may generally preferably be at least $0.2 \text{ J/cm}^2$, more preferably at least $0.4 \text{ J/cm}^2$.

The irradiation of the substrate with ultraviolet radiation may be performed in an oxygen-containing atmosphere, which may conveniently be atmospheric air or preferably be an oxygen atmosphere or an atmosphere containing oxygen diluted with an inert gas, such as Ar or $N_2$ so as to further obviate unnecessary by-products due to irradiation with ultraviolet rays.

The time after the ultraviolet irradiation until the cleaning with pure water may generally be at most 30 minutes, preferably at most 10 minutes. In other words, the cleaning with pure water may preferably be performed when the substrate surface shows a contact angle with water of at most 10 degrees, preferably at most 5 degrees. This means that the cleaning with pure water is started while the substrate surface shows good wettability with pure water.

Anyway, standing for a long time after the ultraviolet irradiation should be avoided, since the effect of the ultraviolet irradiation is lost.

Hereinbelow, the present invention will be described with reference to an embodiment shown in the drawings.

EXAMPLE 1

FIG. 1 is an illustration of an outline of a batch-type cleaning apparatus for use in a method of cleaning substrates for, e.g., liquid crystal devices. Referring to FIG. 1, the apparatus includes an ultraviolet ray irradiation unit 1, wherein 7 U-shaped low pressure mercury lamps of 110 watts ("UVU-110", available from K. K. Oak Seisakusho) having two peaks and wavelengths of 184.9 nm and 253.7 nm were arranged. Into the unit 1, glass substrates 3 (300 mm×300 mm×1.1 mm-t), each provided with a surface pattern of electrodes and held in a cleaning cassette 4, were supplied sheet by sheet for irradiation with ultraviolet rays for 30 seconds per sheet from a distance of about 10 mm.

Then, by an automatic conveying machine, 5 sheets of the glass substrates 3 subjected to the ultraviolet irradiation together with the cleaning cassette 4 were dipped and washed for about 180 seconds in a first ultrasonic cleaning vessel 5 using pure water, and then dipped and washed for about 180 seconds in a second ultrasonic cleaning bath 6, followed by drying with IPA (isopropyl alcohol) vapor in a chamber 7-1 in a drying vessel 7. The substrates thus cleaned were then taken out from the cleaning apparatus and subjected to coating with a polyimide forming liquid by flexograhic printing, whereby a clear polyimide film was found to be formed thereon. The first and second cleaning vessels 5 and 6 were respectively supplied with 500 liters/hour of pure water and, as a result of simple calculation, the substrates were sufficiently cleaned with pure water in a small amount of about 8 liters/sheet.

In contrast thereto, the same level of cleaning required about 16 liters/sheet without the preliminary ultraviolet irradiation prior to the cleaning with pure water.

For evaluating the cleaning performance, glass substrates 3 were intentionally soiled with silica latex particles with an average particle size of 1.2 µm at a rate of about 300 particles/mm² and then cleaned in the above-described manner, whereby an extremely good removal rate of 98% was obtained.

In contrast thereto, when substrates intentionally soiled similarly as above were cleaned without being introduced into the ultraviolet ray irradiation unit 1, i.e., by directly introduced into the first cleaning bath 5, the second cleaning bath 6 and the drying bath 7, a removal rate of only 92% was obtained showing a clearly inferior cleaning state than in the case where the ultraviolet irradiation was performed in advance of the cleaning with pure water. Further, in order to obtain a removal rate of 98%, it was necessary to effect the cleaning sequence though the vessels 5–7 two cycles under identical conditions.

EXAMPLE 2

Figure 2:
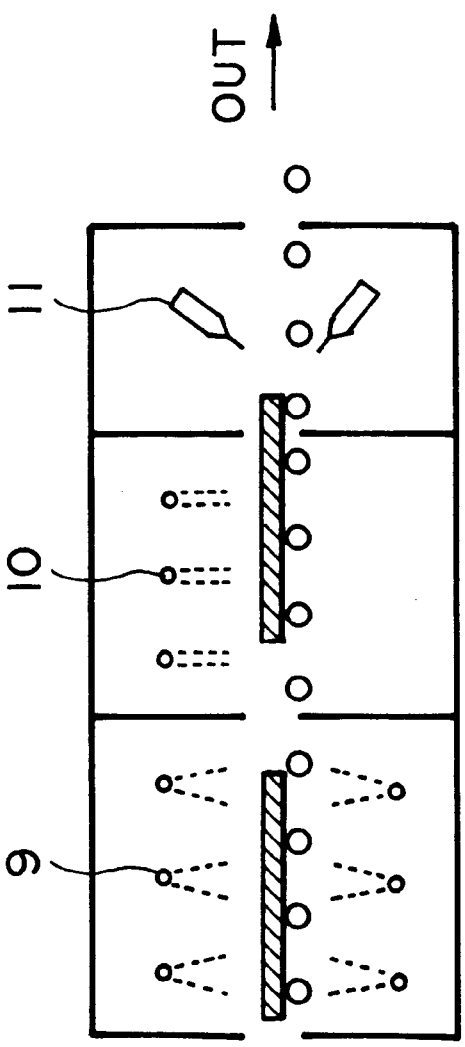
FIG. 2 is an illustration of a sheet-by-sheet type cleaning apparatus for use in a method of cleaning a substrate according to the present invention.

FIG. 2 is an illustration of a sheet-by-sheet cleaning apparatus for practicing a cleaning method for liquid crystal device substrates. Referring to FIG. 2, the apparatus includes an ultraviolet ray irradiation unit 1 wherein 5 U-shaped 110 watt low pressure mercury lamps ("UVU-110", available from K. K. Oak Seisakusho) having two peaks at wavelengths of 184.9 nm and 253.7 nm were arranged. Through the unit 1, glass substrates 3 (300 mm×300 mm×1.1 mm-t), each provided with a transparent electrode film (ITO) on the entirety of one face, were conveyed continuously sheet by sheet to be irradiated with ultraviolet rays from a height of 10 mm for about 40 seconds.

Then, the substrates 3 were subjected to wet cleaning by being sprayed with warm pure water at about 30° C. from a spray nozzle 9 and then subjected to high pressure showering of pure water at about 15 kg.f/cm² from a shower nozzle 10, followed by draining with air knife 11. The thus cleaned substrates were then satisfactorily coated with a positive-type photoresist by roller coating, followed by satisfactory patterning of the ITO film.

For evaluating the cleaning performance similarly as in Example 1, substrates 3 were intentionally soiled with silica latex particles with an average particle size of 1.2 µm at a rate of about 300 particles/mm² and then cleaned in the above-described manner, whereby a good removal rate of 96% was obtained in the case where the ultraviolet irradiation was performed before the cleaning with pure water. In contrast thereto, an inferior cleaning rate of about 89% was measured in the case where the wet cleaning alone was performed.

EXAMPLE 3

The substrates cleaned in Examples 1 and 2 were again subjected to irradiation with ultraviolet rays in an oxygen-containing atmosphere under similar conditions as in the previous examples, whereby further effective cleaning of the substrate surfaces could be performed.

As described hereinabove, according to the present invention, a substrate surface is irradiated with ultraviolet rays including wavelengths at 184.9 nm and 253.7 nm in an oxygen-containing atmosphere immediately before wet cleaning with pure water, whereby it becomes possible to increase the removal rate of dirt, particularly of inorganic matter. As a result, it is possible to shorten the wet cleaning time and decrease the amount of pure water, leading to a decrease in production cost.

What is claimed is:

1. An apparatus for washing glass substrates comprising:
   a cassette for holding a plurality of sheets of glass substrate, each glass substrate having thereon a transparent electrode, prior to irradiation with ultraviolet rays and for holding a plurality of irradiated sheets of glass substrate after irradiation;

ultraviolet exposure means for irradiating said sheets of glass substrate with ultraviolet rays;

holding means for moving a sheet of glass substrate from said cassette to said ultraviolet exposure means for irradiation and for moving an irradiated sheet of glass substrate from said ultraviolet exposure means back to said cassette;

ultrasonic washing means consisting of a first ultrasonic cleaning vessel containing a liquid consisting of water for immersing the cassette to wash the plurality of irradiated sheets of glass substrate and a second ultrasonic cleaning vessel containing a liquid consisting of water for immersing the cassette to wash the plurality of irradiated and once-cleaned sheets of glass substrate, said second ultrasonic cleaning vessel disposed immediately adjacent to said first ultrasonic cleaning vessel;

a drying vessel containing isopropyl alcohol for drying therein the plurality of sheets of glass substrate, said drying vessel disposed immediately adjacent to said second ultrasonic cleaning vessel; and conveying means for moving said cassette holding said plurality of irradiated sheets of glass substrate from said first ultrasonic cleaning vessel to said second ultrasonic cleaning vessel to said drying vessel in this order.

2. The apparatus according to claim 1, wherein the ultraviolet rays exhibit wavelength peaks at 184.9 nm and 253.7 nm.

3. A process for producing a liquid crystal device comprising selecting at least one glass substrate having thereon a transparent electrode and washing said glass substrate using an apparatus according to claim 1.

4. A process for producing a liquid crystal device comprising selecting at least one glass substrate having thereon a transparent electrode and washing said glass substrate using an apparatus according to claim 2.

\* \* \* \* \*